(12) United States Patent
Burns et al.

(10) Patent No.: US 7,866,480 B2
(45) Date of Patent: Jan. 11, 2011

(54) FRONT OPENING SUBSTRATE CONTAINER WITH BOTTOM PLATE

(75) Inventors: John Burns, Colorado Springs, CO (US); Matthew A. Fuller, Colorado Springs, CO (US); Jeffery J. King, Colorado Springs, CO (US); Martin L. Forbes, Divide, CO (US); Mark V. Smith, Colorado Springs, CO (US)

(73) Assignee: Entegris, Inc., Billerica, MA (US)

( * ) Notice: Subject to any disclaimer, the term of this patent is extended or adjusted under 35 U.S.C. 154(b) by 504 days.

(21) Appl. No.: 11/786,035

(22) Filed: Apr. 10, 2007

(65) Prior Publication Data

US 2008/0017547 A1 Jan. 24, 2008

Related U.S. Application Data

(62) Division of application No. 10/982,400, filed on Nov. 5, 2004, now Pat. No. 7,201,276.

(60) Provisional application No. 60/518,064, filed on Nov. 7, 2003.

(51) Int. Cl.
*B65D 85/90* (2006.01)
(52) U.S. Cl. ........................ 206/711; 220/745
(58) Field of Classification Search ............... 206/710, 206/711, 454, 832; 211/41.14, 41.18; 220/367.1, 220/371, 745
See application file for complete search history.

(56) References Cited

U.S. PATENT DOCUMENTS

| | | | |
|---|---|---|---|
| 4,552,288 A | 11/1985 | Flider | |
| 4,696,395 A | 9/1987 | Rivoli | |
| 5,755,332 A * | 5/1998 | Holliday et al. | 206/711 |
| 6,042,651 A * | 3/2000 | Roberson et al. | 206/711 |
| 6,273,261 B1 | 8/2001 | Hosoi | |
| 6,398,032 B2 | 6/2002 | Fosnight et al. | |
| 6,513,658 B1 | 2/2003 | Adkins | |
| 6,520,338 B2 | 2/2003 | Bores et al. | |
| 6,811,029 B2 | 11/2004 | Eggum | |
| 2002/0149319 A1 | 10/2002 | Kim et al. | |
| 2003/0047562 A1 | 3/2003 | Wu et al. | |
| 2003/0106830 A1 | 6/2003 | Eggum | |
| 2005/0077204 A1 | 4/2005 | Sumi et al. | |

FOREIGN PATENT DOCUMENTS

KR 2002-0046887 6/2002

* cited by examiner

*Primary Examiner*—J. Gregory Pickett
(74) *Attorney, Agent, or Firm*—Patterson Thuente Christensen Pedersen, P.A.

(57) ABSTRACT

A substrate container and a bottom plate are connected with a mechanism for adjusting the distance between the container and bottom plate, by, e.g., a threaded connection between two members of the connector mechanism. Also provided are a duck-billed valve for venting the container and a dampener for minimizing damage due to shocks.

20 Claims, 5 Drawing Sheets

FRONT OPENING SUBSTRATE CONTAINER WITH BOTTOM PLATE

CROSS-REFERENCES TO RELATED APPLICATIONS

This application is a divisional of application Ser. No. 10/982,400 filed Nov. 4, 2005, now U.S. Pat. No. 7,201,276 issued Apr. 10, 2007, which claims the benefit of U.S. Provisional Application No. 60/518,064 filed Nov. 7, 2003.

FIELD OF THE INVENTION

This invention relates to sealable containers with latching systems for confining silicon wafers, flat panels, other substrates and the like for transport storage and processing. More particularly the invention relates to such containers with lower plates for providing engagement and interface with associated equipment.

BACKGROUND

Wafer carriers or pods are utilized for holding, transporting, and storing substrates before, during and after processing. Such substrates are used in the fabrication of semiconductors such as integrated circuits and liquid crystal display panels. In their transformation into the end product, these delicate and highly valuable substrates are subjected to repeated processing, storage, and transportation. Such substrates must be protected from damage from particular contaminants, static discharges, physical damage from breakage, or contamination from vapors or gasses such as those outgassing from materials used in processing.

Such substrate containers are termed FOUPs, an acronym for front opening unified pods and FOSBs, an acronym for front opening shipping box. Industry standards specify that such substrate containers utilize kinematic couplings comprising three radially oriented grooves on the bottom of the container that interface with three rounded projections arranged in a triangle on the processing equipment. These kinematic couplings provide for the precise orientation of the wafer containers, thereby allowing for precise manipulation of the container and contents, for example robotic removal and insertion of the wafers. Such containers typically will have means for allowing robotic transfer of the containers with contents. Such means may include a robotic flange on the top of the wafer container as well as suitable rails or other features on the bottom of the container to allow the container to be suitably conveyed on conveyors with rollers or suitable carriages. It is apparent that sudden starts and stops, that is jarring of the wafer container with loaded wafers, can cause damage to the wafers. Thus, it is appropriate to provide suitable cushioning for the wafers during transport, including conveyance within a facility. The wafer restraints and exterior packaging conventionally provide such cushioning during transport from facility to facility. It is also desirable to have additional dampening and cushioning for the wafers when the containers are transported by way of conveyors that engage the bottom plate of the FOUP and/or FOSB's within a facility.

Such FOUP's and FOSB's utilize latching mechanisms in their doors with seals to create a hermetically sealed container. Such containers then need vents and/or purges to prevent deformation of the carrier or unintended leakages due to pressure differentials, for example, changes in barometric pressure. Utilizing such filters in various locations on the pods are known in the art and typically have an aperture in the shell with a suitable fixture and filter secured at the aperture. Generally, it is considered desirable by the industry to minimize the number of openings leading into such containers. Prior art containers typically utilize molded-in openings in the shell portion for attachment of such filters or purging features.

In that the kinematic coupling must be precisely positioned with respect to wafer shells to allow for these precise interactions of processing equipment with the container and wafers, the positioning of the three grooves on the bottom of the wafer container with respect to the shelf location is absolutely critical. In that these wafer containers are conventionally molded of thermal plastics which may warp and distort during the molding process or subsequently, great care must be taken to provide this precise positioning. Known means for attaching the kinematic coupling features to the container portion include direct molding of the grooves in the shell, attachment of a separate plate with the grooves by way of screws, utilization of an interior super structure that includes the wafer shell and a lower plate that has the grooves and that is inserted within the shell portion. It would be desirable to utilize a separately molded plate attachable to the container that has adjustment capability and that is securely attached by more than the minimal near point attachment provided by screws. Such a separate plate can thus easily add additional features such as conveyor interface features, for example rails, coating means, and attachment means for other accessories by using different plate configurations or simply attaching the items to the plate. Also suitable means should ideally be provided for facilitating grounding of the wafer contact areas on the shell through the kinematic coupling to the kinematic coupling protrusions on the equipment or other receiving base upon which the wafer container is seated.

SUMMARY OF THE INVENTION

A front opening substrate carrier having a container portion and a latching door to close the container portion has a separately formed plate that attaches to the bottom of the container portion providing unique attachment means and novel features and advantages. In preferred embodiments the bottom plate has a kinematic coupling groove with contact surfaces formed therein and conveyor rails positioned at the perimeter of said plate. In preferred embodiments the plate may be attached at a plurality of locations on the bottom of the container portion by way of a plurality of large diameter connectors, for example, greater than about one-half inch and less than three inches, extending through cooperating holes on the plate and container portion. Such connections may be made by a unitary snap-in bushing that may be closed or have a bore extending therethrough. Said bore in preferred embodiments may be configured for receiving filter and/or valve cartridges or members. Additionally, such attachment positions may utilize elastomeric bushings or differently configured elastomeric members to provide dampening between the conveyor plate and the shell.

In other preferred embodiments, the container portion may have a plurality of openings on the bottom that have a first member attached thereto with a threaded end that engages a second member attached to the plate with at least one of the members rotatable to provide precise vertical positioning of the plate with respect to the shell or container portion and thus with respect to the wafer support shell. Said adjustment means may utilize an O-ring or similar friction-providing device to secure the two threaded members in the desired position. Said threaded members may both be formed separately from the container portion and plate, may snap into place, may utilize O-rings for suitable sealing, and may have a bore extending through both members for receiving a filter and/or valve cartridge or members.

In preferred embodiments, a cartridge may be provided that includes a duck bill purge valve formed of a thermal plastic elastomer with a V or inverted V-shape in one direction and a rectangular shape in a direction taken perpendicular to said first direction. Adding a slit subsequent to the molding of said member may preferably form said duckbill valve. Additionally, the cartridge may have filter members.

In preferred embodiments elastomeric cushioning members may be positioned at some of the connection points between the container portion and the plate or between all of the connection points between the plate and the container portion thereby providing total isolation of the plate from the container portion by way of the elastomeric dampeners. In other embodiments, the elastomeric dampeners may be positioned to dampen the vibrations caused by conveyance on peripheral rails of the plate while allowing separate rigid fasteners to provide precise and rigid connection of the more inner portions of the conveyor plate, thereby allowing the precise positioning of the kinematic coupling grooves to the wafer shells.

DETAILED DESCRIPTION OF PREFERRED EMBODIMENTS

Figure 1:
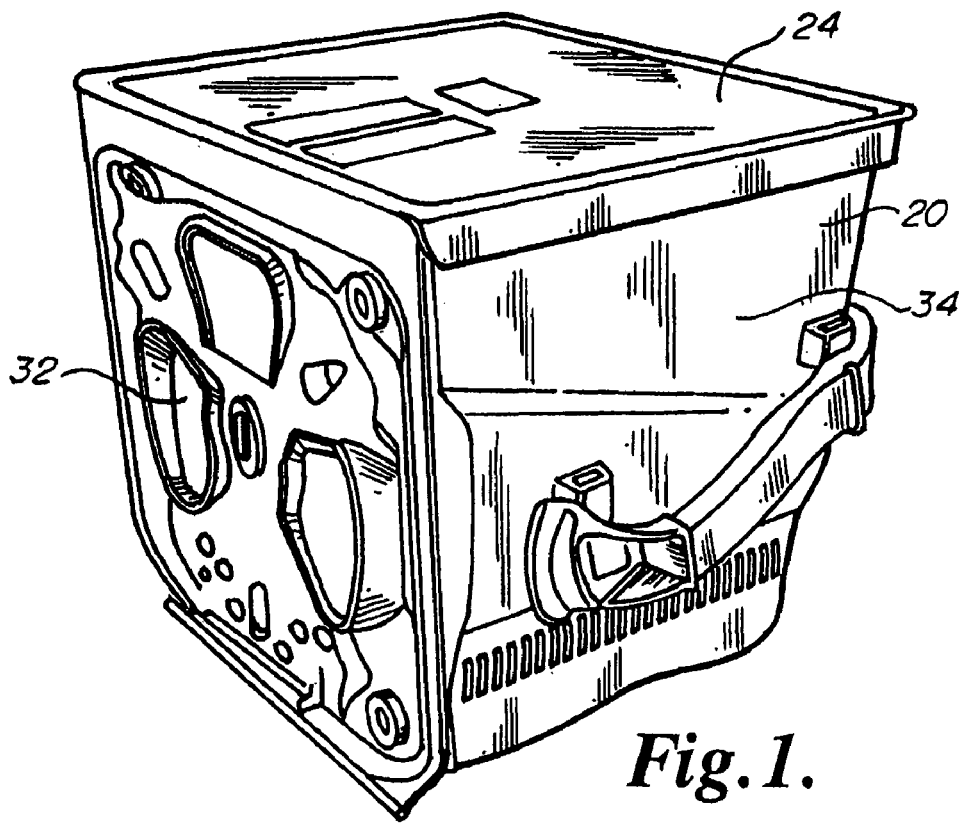
FIG. 1 is a perspective view of a front opening wafer container tipped on its backside to illustrate the bottom plate, which embodies aspects of the invention herein.
Figure 2:
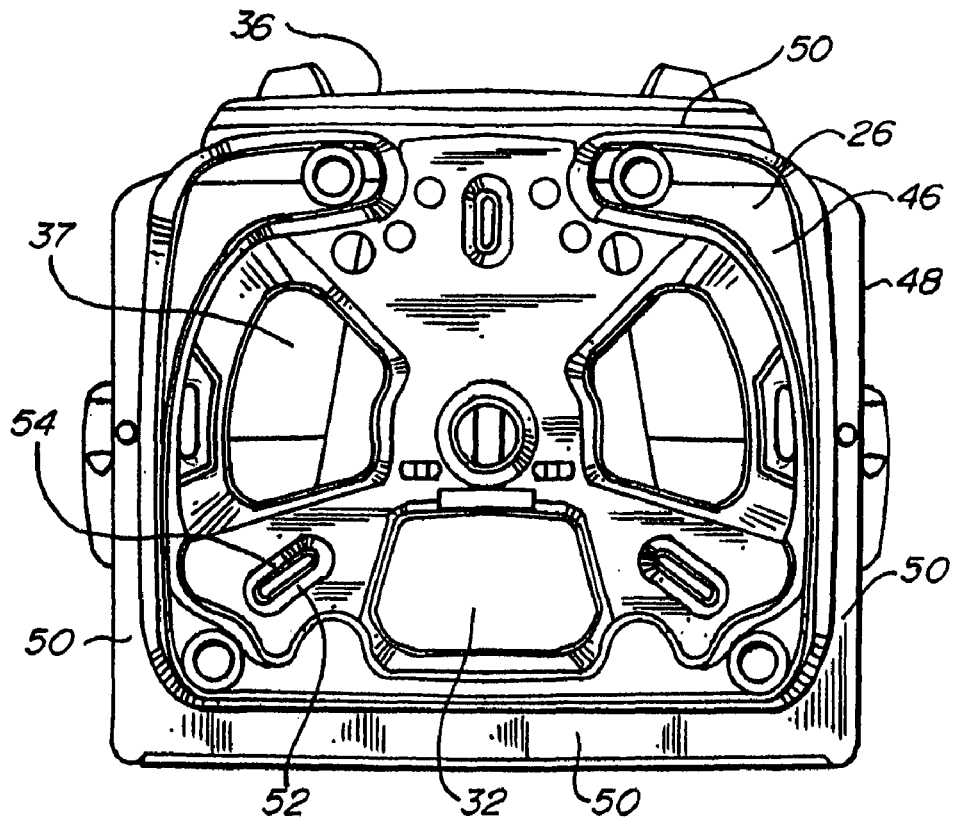
FIG. 2 is a bottom plan view of a plate attached to the bottom of a wafer container embodying the inventions herein.

FIGS. 1, 2, 3, and 4 show different views of a wafer carrier that embody the inventions herein. The carrier is configured as a wafer container, such as a FOSB or FOUP, and is comprised principally of a container portion 20 with an open front 22, a door 24 to close the open front, and a bottom plate 26. The container portion generally has a top 30, a bottom 32, sides 34, back 36, bottom surface 37, and an open interior 38. Positioned in the interior at the sides of the container portion are wafer supports 40 for supporting wafers with a single wafer W illustrated in FIG. 4. Front opening wafer carriers know in the art have features such as illustrated in U.S. Pat. Nos. RE 28,221; 6,010,008; 6,267,245; commonly assigned with this application, all of which are incorporated herein by reference.

Figure 3:
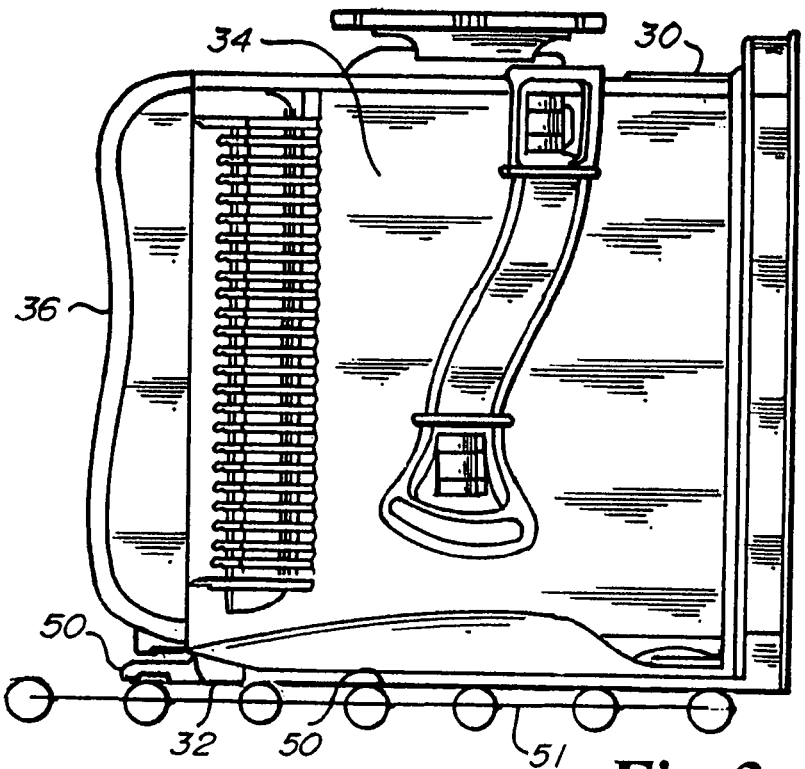
FIG. 3 is a side elevational view of a wafer carrier according to the invention herein.
Figure 4:
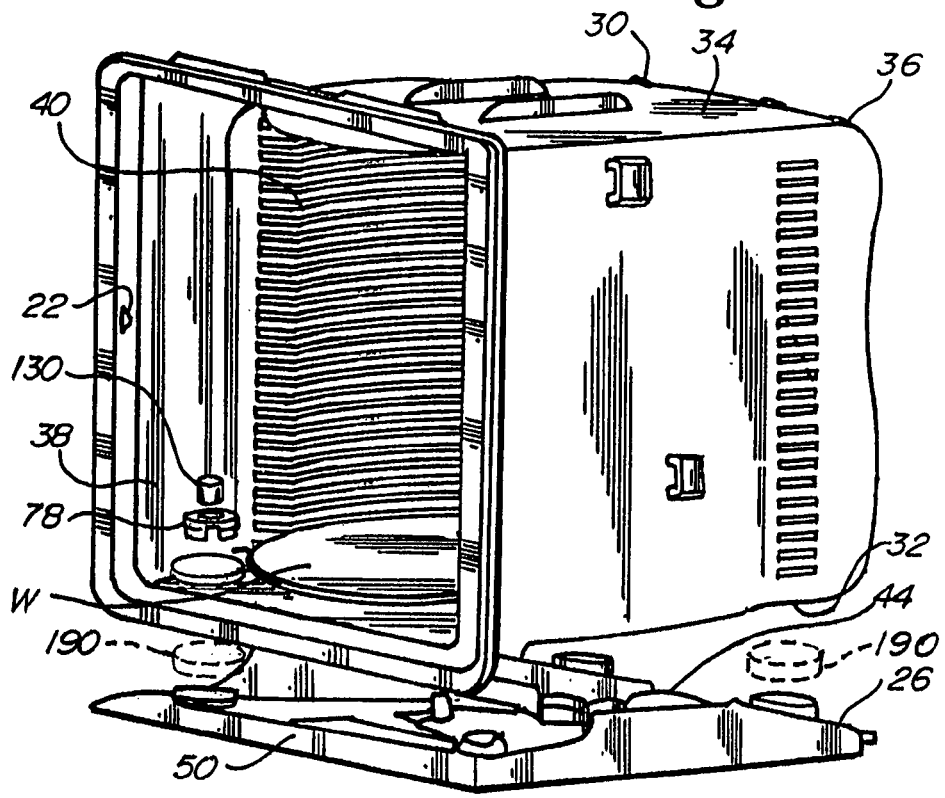
FIG. 4 is an exploded perspective view of a container portion, plate, and connectors according to the inventions herein.
Figure 5:
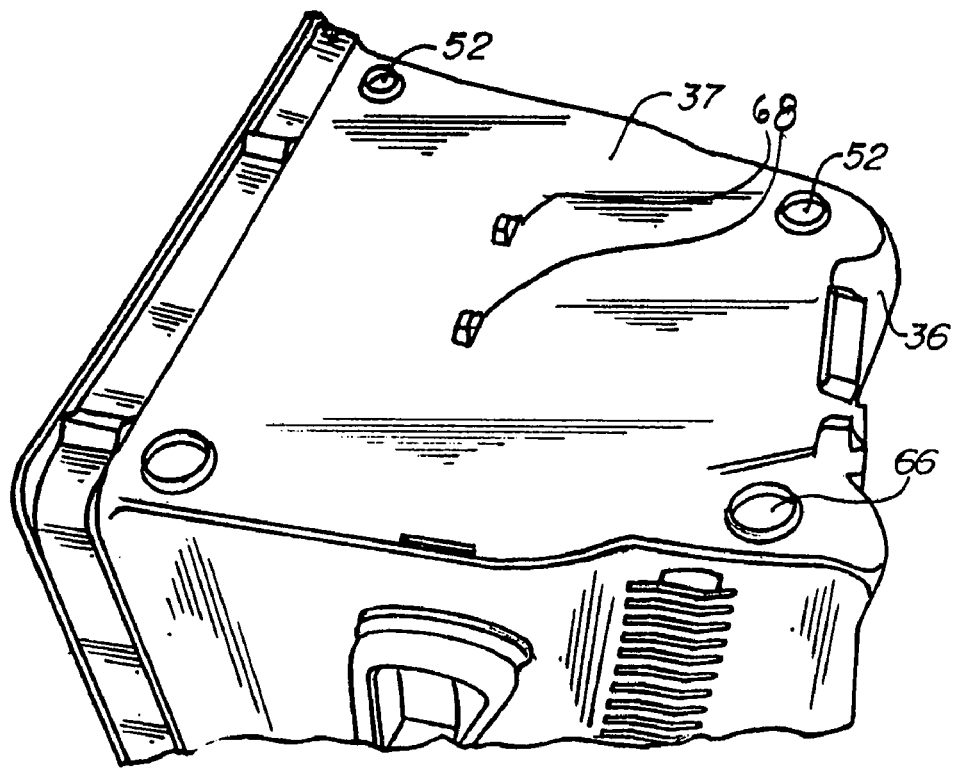
FIG. 5 is a perspective view of the bottom of the wafer container of FIG. 1 without the plate attached.
Figure 6:
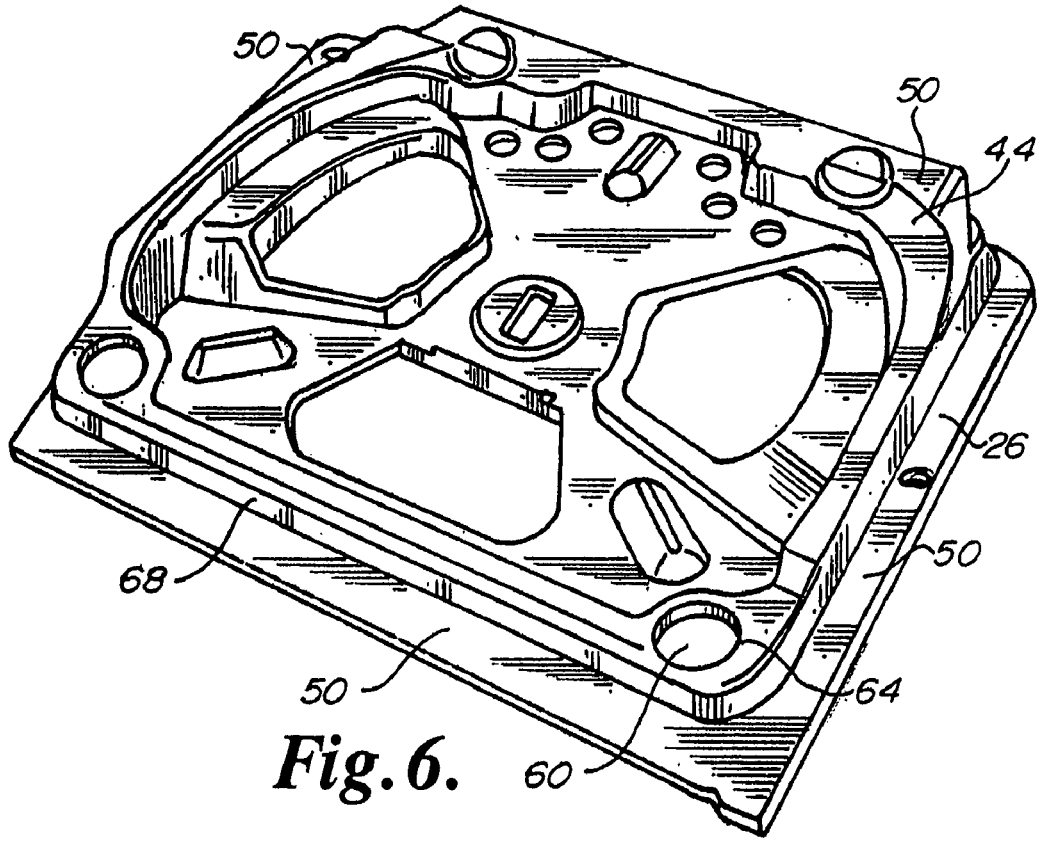
FIG. 6 is a perspective view of the top side of the plate illustrated in FIG. 1.
Figure 7:
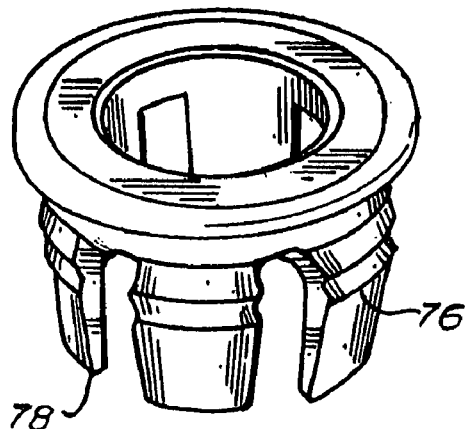
FIG. 7 is a perspective view of a pronged connector according to aspects of the invention herein.

Referring to FIGS. 2, 3, 4, and 6 details of the bottom plate are illustrated. The bottom plate has a top surface 44, a bottom surface 46, and a periphery 48. Rail portions 50 for interfacing with conveyor, such as the conveyor 51 illustrated in FIG. 3, are located on the front side, back side, left side, and right side of the periphery of the plate. The plate has three kinematic coupling grooves 52 each having kinematic coupling surfaces 54 for engaging the prongs of a cooperating kinematic coupling interface on the processing equipment or other fixture upon which the container is seated. The plate has four apertures 60 which match cooperating apertures 62 on the bottom 37 of the container portion. In one embodiment, pronged bushings as illustrated in FIG. 4 and FIG. 7 may be utilized to extend through the aperture in the container portion and the aperture in the plate to secure the two aperture peripheries 64, 66 together. Additional structural ribbing 68 provides structural support and engagement contact with the bottom surface 37 of the container portion.

Figure 8:
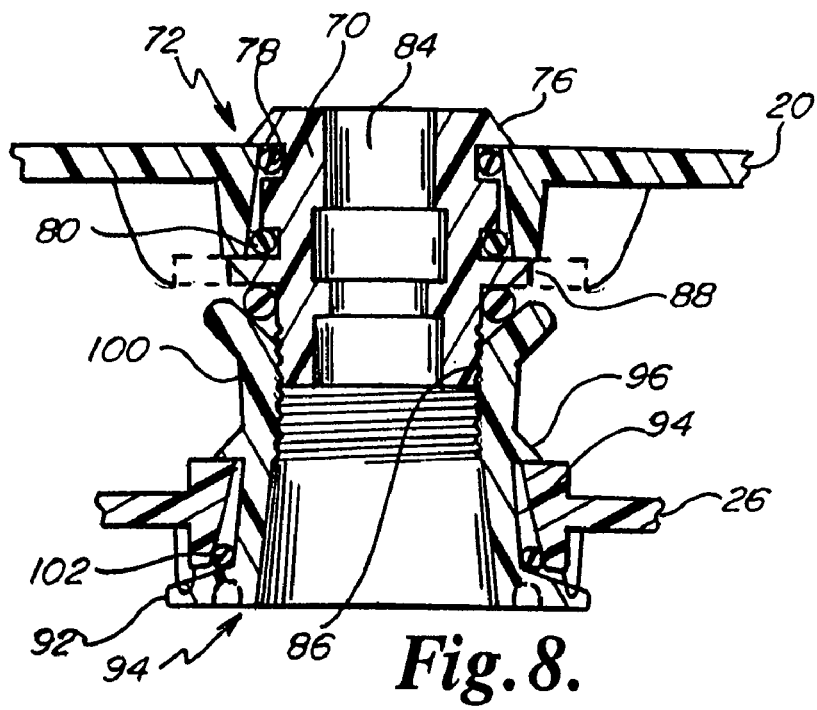
FIG. 8 is a cross-sectional view of an apparatus and method to adjust wafer plane using threaded members connecting the container portion with the plate in accordance to the invention herein.
Figure 9:
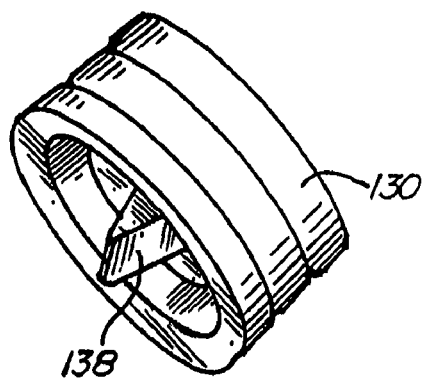
FIG. 9 is a perspective view of an alternative filter/valve cartridge according to aspects of the invention herein.
Figure 10:
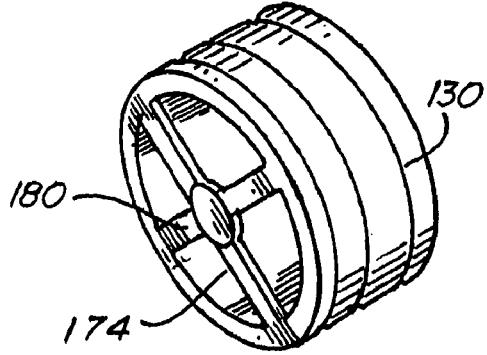
FIG. 10 is a perspective view of an alternative filter/valve cartridge according to aspects of the invention herein.
Figure 11:
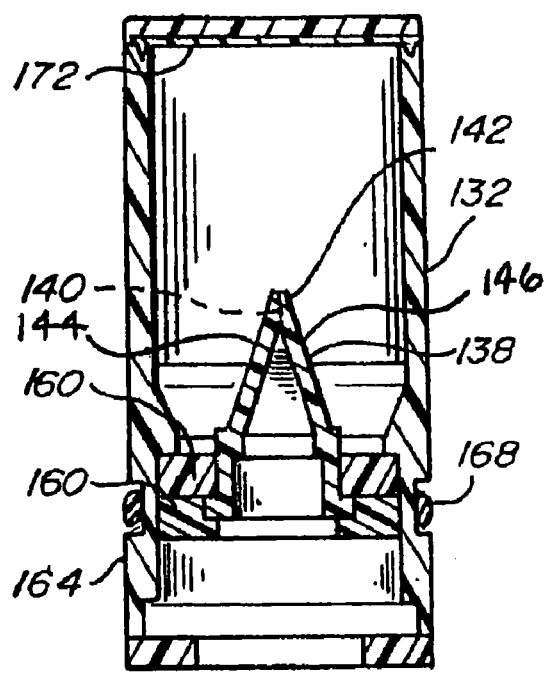
FIG. 11 is a cross-sectional view of a duckbill valve in accordance to the invention herein.
Figure 12:
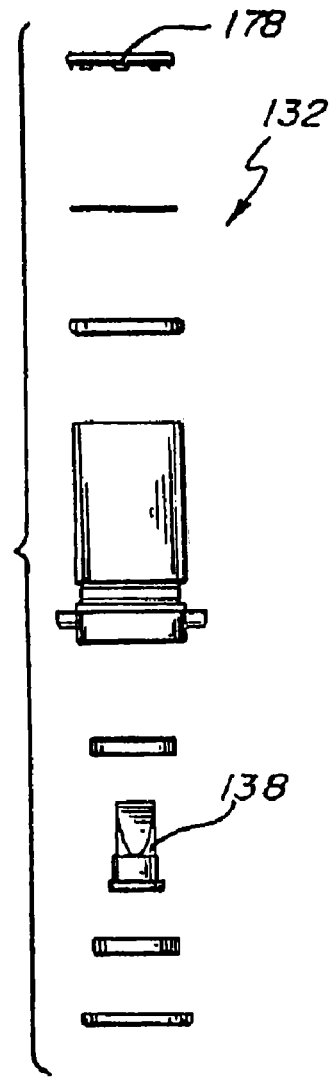
FIG. 12 is an exploded view of the duckbill valve of FIG. 11.

Referring to FIG. 8, a further methodology and apparatus (spacer) 169 for connecting the bottom plate 26 to the container portion or shell 20 is disclosed. A first bushing 70 snaps into place into the aperture 72 in the shell and is secured in place by way of detents 76. O-rings 78, 80 provide tightening and stability of the system as well as frictionally securing the first bushing in place. The first bushing has a bore 84, a threaded end portion 86, and a collar 88. A second connecting member 92 configured as a second annular bushing snaps into place into an aperture 94. In the plate detents 96 secure the second annular bushing in place within the aperture in the plate. The second annular bushing has an upper end 100 that is threaded to cooperate with the threaded end of the first annular bushing. The spacing between the conveyor plate 26 and the shell can be precisely adjusted by way of rotation, in this embodiment, of the second annular bushing 92 with respect to the first annular bushing 70. Additional O-rings 102 provide a frictional means to retain the second annular bushing at the desired rotational position for the correct adjusted position. The filter/cartridge described below, a plug, or a filter may be deposited in the bore 84.

Referring to FIGS. 9, 10, 11, and 12 embodiments of a filter/valve cartridge 130, 132 are illustrated. The cartridges significantly have a duckbill valve member 138 that is preferably formed from injection molding a material and secondly slicing a slit 140 in the apex 142 of the duckbill valve member, thereby forming flaps 144 and 146. The duckbill valve member is suitably positioned in place by way of collars 160 into a cartridge shell 164. O-rings 168 may be utilized to seal the cartridge in place in a suitably sized aperture such as bore 84. The cartridges of FIGS. 9, 10, and 11 also have a filter member 172, 174 made of suitable filtering material that is known in the art. Retention member 178, 180 respectively holds the filter members in place in the cartridge.

Figure 13:
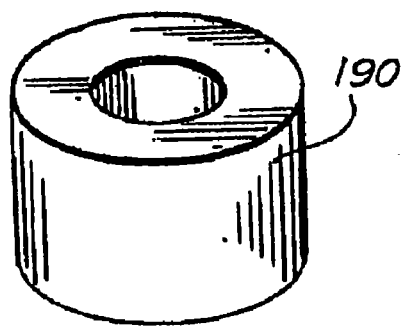
FIG. 13 is a perspective view of an elastomeric dampener according to aspects of the invention herein.

Referring to FIG. 13, a further inventive aspect of the wafer carrier is illustrated and comprises an elastomeric dampener 190. Said dampener is positioned intermediate the shell and the plate to absorb any shock imparted to the plate to minimize transference of same to the wafers. The elastomeric dampener, as illustrated by the numbers 190 in phantom in FIG. 4, may be positioned at the respective apertures 60, 62 of the plate shell. Alternatively, the elastomers can be placed using other suitable structural features at other locations in between the shell and plate. The bushing may be utilized to provide complete isolation that is in between the plate and the shell with no direct rigid plastic to rigid plastic contact between the shell and the plate. Alternatively there can be direct engagement between rigid components of the shell and the plate and the dampeners can be placed near the periphery of the plate to provide some measure of dampening at the plates periphery particularly when the conveyor rails 50 are in use for conveying the wafer carrier. In a further embodiment, the kinematic coupling can be integral with the shell or container portion and be exposed at the bottom; the plate can have the conveyor rails that engage a conveyor 51 as shown in FIG. 3 and be isolated from the shell by the dampeners.

Various materials are suitable for manufacturing the components of the wafer carrier. For example PEI with carbon fiber filler is suitable for the shell as well as the plate. Carbon fiber filled peek is also suitable but is more expensive. Polycarbonate particularly carbon powder filled polycarbonate may also be utilized but has less desirable characteristics with regard to flammability and smoke and fume generation when burning.

Thus, various inventive aspects of the substrate carrier are described and portrayed herein. Said inventive aspects specifically include, without limitation, individually and in various combinations, the utilization of the elastomeric dampener intermediate the conveyor plate and the shell; the utilization of a plurality of relatively large diameter that is greater than one-half inch structural attachment members, extending through the shell and plate; utilization pronged bushings to secure the plate on the shell; utilization of connectors with bores extending therethrough that permit insertion of filter/valve cartridges within said bores; utilization of adjustable threaded members for positioning the precise location of the plate with regard to the wafer shell and wafer planes; utilization of O-rings to lock or secure the respective members in the appropriate position; utilization of threaded members for the adjustment and attachment that utilize a bore extending therethrough for insertion of a filter cartridge, valve cartridge, a combination of both, or a solid blank. The utilization of a valve configured as a duckbill valve formed from the elastomeric material to provide purging and/or pressure equalization is further provided.

Although the features herein are illustrated generally with reference to semiconductor wafer containers, the inventive aspects also are applicable and claimed with respect to flat panel carriers, reticle carriers, film frame carriers and the like.

What is claimed is:

1. A container, comprising:
   a container portion having an interior and an exterior;
   supports disposed in the interior for accommodating a substrate;
   a door sealingly accommodated by the container portion;
   a bottom plate connected to the container portion at a plurality of locations and having a plurality of radially aligned kinematic grooves, the bottom plate spaced from the container portion except at said plurality of locations;
   at least one bore extending through the bottom plate and the container portion at one of the plurality of locations where the bottom plate is connected to the container portion and providing fluid communication between the interior of the container portion and the exterior; and
   a valve disposed in said at least one bore.

2. The container of claim 1, in which the valve is a check valve.

3. The container of claim 1, further comprising a filter positionally disposed to filter air entering the container portion via said valve when said valve is open.

4. The container of claim 1, further comprising:
   a plurality of adjustable spacers for adjusting a positioning of the bottom plate with respect to the container portion, each of said adjustable spacers comprising a first member and a second member threadably connected to the first member.

5. The container of claim 4, wherein the positioning of the bottom plate with respect to the container portion is adjustable by way of rotation of at least one of the first member and the second member.

6. The container of claim 1, further comprising an elastomeric dampener disposed between the bottom plate and the container portion.

7. A substrate container, comprising:
   a container portion with an open front, the container portion comprising a pair of opposite side walls, a bottom wall, a top wall, and a back wall connecting and defining an open interior and a plurality of substrate supports in the open interior for supporting substrates;
   a door for sealingly closing the open front;
   a bottom plate connected to the container portion at a plurality of locations, the bottom plate spaced apart from the container portion except at said plurality of locations;
   at least one bore positioned at one of the plurality of locations providing fluid communication between the interior of the container portion and an exterior of the container portion; and
   at least one of a valve, filter, or plug positioned in the at least one bore.

8. The substrate container of claim 7, wherein a check valve is positioned in the at least one bore.

9. The substrate container of claim 7, wherein a duckbill valve is positioned in the at least one bore.

10. The substrate container of claim 7, wherein the at least one bore includes both a valve and a filter positioned therein.

11. The container of claim 7, further comprising:
    a plurality of adjustable spacers for adjusting a positioning of the bottom plate with respect to the container portion, each of said adjustable spacers comprising a first member and a second member threadably connected to the first member.

12. The container of claim 11, wherein the positioning of the bottom plate with respect to the container portion is adjustable by way of rotation of at least one of the first member and the second member.

13. The container of claim 7, further comprising an elastomeric dampener disposed between the bottom plate and the container portion.

14. A substrate container, comprising:
    a container portion with an open front, the container portion comprising a pair of opposite side walls, a bottom wall, a top wall, and a back wall connecting and defining an open interior and a plurality of substrate supports in the open interior for supporting substrates;
    a door for sealingly closing the open front;
    a coupling plate connected to the container portion for coupling the container portion to a machine interface;
    at least one aperture fluidly communicating the interior of the container portion with an exterior of the container portion extending through a location where the coupling plate is connected to the container portion; and
    at least one of a valve, filter, or plug positioned in the at least one bore.

15. The substrate container of claim 14, wherein a check valve is positioned in the at least one bore.

16. The substrate container of claim 14, wherein a duckbill valve is positioned in the at least one bore.

17. The substrate container of claim 14, wherein the at least one bore includes both a valve and a filter positioned therein.

18. The container of claim 14, further comprising:
a plurality of adjustable spacers for adjusting a positioning of the coupling plate with respect to the container portion, each of said adjustable spacers comprising a first member and a second member threadably connected to the first member.

19. The container of claim 18, wherein the positioning of the coupling plate with respect to the container portion is adjustable by way of rotation of at least one of the first member and the second member.

20. The container of claim 14, further comprising an elastomeric dampener disposed between the coupling plate and the container portion.

* * * * *